US 6,317,068 B1

(12) United States Patent
Gattani et al.

(10) Patent No.: US 6,317,068 B1
(45) Date of Patent: Nov. 13, 2001

(54) METHOD AND APPARATUS FOR MATCHING COMMON MODE OUTPUT VOLTAGE AT A SWITCHED-CAPACITOR TO CONTINUOUS-TIME INTERFACE

(75) Inventors: Amit Gattani, Tinton Falls, NJ (US); Paul James Hurst, Vacaville; David William Cline, Sacramento, both of CA (US)

(73) Assignee: Level One Communications, Inc.

( * ) Notice: Subject to any disclaimer, the term of this patent is extended or adjusted under 35 U.S.C. 154(b) by 0 days.

(21) Appl. No.: 09/378,993

(22) Filed: Aug. 23, 1999

(51) Int. Cl.[7] ....................................... H03M 1/66

(52) U.S. Cl. ............................ 341/150; 341/172

(58) Field of Search ..................... 341/120, 118, 341/150, 172; 375/75, 98, 150

(56) References Cited

U.S. PATENT DOCUMENTS

| | | |
|---|---|---|
| 4,937,842 | 6/1990 | Howell . |
| 5,245,344 * | 9/1993 | Sooch .................................. 341/150 |
| 5,257,026 | 10/1993 | Thompson et al. . |
| 5,305,004 | 4/1994 | Fattaruso . |
| 5,391,999 * | 2/1995 | Early et al. ............................ 327/337 |
| 5,517,249 | 5/1996 | Rodriquez-Cavazos et al. . |
| 5,583,501 | 12/1996 | Henrion et al. . |
| 6,101,172 * | 8/2000 | Van Bavel et al. .................. 370/295 |

FOREIGN PATENT DOCUMENTS 9 766 379 A1   4/1997  (EP) .

OTHER PUBLICATIONS

"An Overview of Basic Concepts"; J.C. Candy; *Delta–Sigma Data Converters Theory, Design, and Simulation*; Ch. 1, pp. 1–13.

"Linearity Enhancement of Multibit ΔΣ A/D and D/A Converters Using Data Weighted Averaging"; *IEEE Transactions on Circuits and Systems—II: Analog and Digital Signal Processing*, vol. 42, No. 12, Dec. 1995; pp. 753–762.

"A High Resolution Multibit Sigma–Delta Modulator with Individual Level Averaging"; *IEEE Journal of Solid–State Circuits*, vol. 30, No. 4, Apr. 1995; pp. 453–460.

"Digitally Corrected Mult–Bit ΣΔ Data Converters"; T. Cataltepe et al.; Electrical Engineering Department, UCLA; 1989; pp. 647–650.

* cited by examiner

*Primary Examiner*—Peguy Jean Pierre
*Assistant Examiner*—Joseph Lauture
(74) *Attorney, Agent, or Firm*—Altera Law Group, LLC

(57) ABSTRACT

A method and apparatus for matching common mode output voltage at a switched-capacitor to continuous-time interface. An active continuous time summation circuit is used at the output of the switched-capacitor stage to derive the common mode level that is at the output of the switched-capacitor stage. This derived signal is filtered to remove any noise component remaining in it, and is then used as the reference common mode signal in the continuous time stage. This forces the output common mode, and hence the input common mode of the unity gain amplifier stage, to track the common mode output of the switched-capacitor stage. This adaptive tracking eliminates the common mode interface error, which could be present and could vary from die to die (due to parasitic variations). This technique ensures proper tracking of the DC levels between the negative and the positive terminals of the unity gain amplifier, which is essential for low distortion operation of the amplifier.

24 Claims, 4 Drawing Sheets

METHOD AND APPARATUS FOR MATCHING COMMON MODE OUTPUT VOLTAGE AT A SWITCHED-CAPACITOR TO CONTINUOUS-TIME INTERFACE

BACKGROUND OF THE INVENTION

1. Field of the Invention

This invention relates in general to telecommunications, and more particularly to a method and apparatus for matching common mode output voltage at a switched-capacitor to continuous-time interface.

2. Description of Related Art

Global communications continues to demonstrate rapid growth rates. As more people become accustomed to the convenience of electronic mail, web-based facsimile transmission, electronic commerce, telecommuting and high-speed Internet access, the demand on the telecommunications industry to provide adequate bandwidth to provide this type of service also increases. The growth in the number of people using electronic communications will only increase as the price of Internet access and Internet access devices such as personal digital assistants (PDAs), computers, etc.

Today, copper telephone lines service almost all voice traffic and most of the Internet traffic. However, as content rich applications continue to grow, both public and private copper access networks are being challenged. The local portion of the enterprise becomes a major challenge for access providers. To take advantage of the increasingly popular innovations in telecommunications technology, additional telephone lines are being installed in private residences and businesses.

Although analog modems have managed to stretch their potential speed to 56 kilobits per second (kbps), small-office/home-office (SOHO) customers need far greater Internet bandwidth to accommodate multimedia applications ranging form three-dimensional web sites to video conferencing. Analog modems cannot deliver the necessary bandwidth and, therefore, have reached the end of their usefulness.

In response to these developments, communications companies are responding with a variety of digital access solutions, all variants of Digital Subscriber Line (DSL) technology. These DSL technologies differ dramatically in their abilities to address major SOHO applications and the requirements of telephone companies.

DSL technologies are transport mechanisms for delivering high-bandwidth digital data services via twisted-pair copper wires. These copper wires provide the cabling between the telephone company's central offices and subscribers. DSL technology is a copper loop transmission technology that solves the bottleneck problem often associated with the last mile between Network Service Providers and the users of those network services. DSL technology achieves broadband speeds over ordinary phone wire. While DSL technology offers dramatic speed improvements (up to 7+ Mbps) compared to other network access methods, the real strength of DSL-based services lies in the opportunities driven by multimedia applications required by today's network users, performance and reliability and economics.

Without such transport mechanisms, subscribers would have to rely on T1 (1.5 Mbps) or E1 (2.0 Mbps) service, which requires the phone company to install expensive new cabling to every location that wants high-speed digital service. The installation costs make T1/E1 service expensive. The original DSL service was ISDN DSL (ISDL), which was defined in the late 1980s. ISDL provides 160 kbps rates over a single twisted-pair at ranges up to 18,000 feet from the telephone company's central office. While this service has been deployed to may homes and small businesses all over the world, the demands of multimedia applications are already challenging IDSL's bandwidth.

Asymmetric Digital Service Line (ADSL) is currently being embraced by residential web surfers for its ability to quickly download music and video files. ADSL refers to modem technology that transforms twisted copper pair (ordinary phone lines) into a pipeline for ultra fast Internet access. As the name suggests, ADSL is not asynchronous transmission, but rather asymmetric digital transmission, i.e., ADSL transmits more than 6 Mbps (optionally up to 8 Mbps) to a subscriber, and as much as 640 kbps (optionally up to 1 Mbps) in the other direction.

ADSL has the ability to increase normal phone line capacity by 99% via a digital coding technique. This extra capacity means that one could simultaneously assess the World Wide Web and use the telephone or send a fax. A user of this technology could have uninterrupted Internet access that is always on-line. This technology also has the potential to be a cost-effective solution for residential customers, telecommuters and small business.

Still, there is a need for symmetric high-speed connection. For example, small businesses have become increasingly dependent on sophisticated voice and data products and services for competing against larger corporations. Until now, the cost of providing small businesses with professional telephony and data services was prohibitive. However, integrated access and virtual public branch exchanges (PBXs) are providing small businesses with voice mail, high-speed Internet access, multiple business lines and sufficient capabilities for telecommuters.

As mentioned above, symmetric services were traditionally delivered by T1 and E! lines. Within the DSL family, HDSL has long been used to provision T1 lines because its long reach requires regeneration-signal boosting-only every 12,000 feet, compared with every 4,000 feet for other T1 provisioning techniques. In fact, HDSL's ability to simplify and cheapen T1 deployment has made HDSL by far the most established of the DSL technology family.

As an inexpensive and flexible replacement for leased T1 lines, the HDSL2 standards are eagerly awaited by the DSL industry. HDSL2 replaces the aging HDSL standard that required two copper pairs. HDSL2 uses only one copper pair and is potentially rate adjustable. HDSL2, which is being developed within the framework of the American National Standards Institute (ANSI, New York), promises to make HDSL more compelling in two ways. While HDSL was a proprietary technique-modems at the central office (CO) and the customer premises had to come from the same vendor-HDSL2 will be an interoperable standard in which modems can be mixed. Perhaps the biggest selling point of HDSL2, however, is that it can use one pair of copper wires instead of HDSL's two. Network service providers thus have a choice. HDSL and one-pair HDSL2 have about the same reach, while two-pair HDSL2 adds as much as another 4,000 feet of reach, depending on the gauge of copper and other conditions. Hoping to propel the new DSL technology into the business arena, eight chip makers and OEMs have formed a consortium for the HDSL2 standard.

An HDSL2 transceiver includes a framer, a data pump and an analog interface for coupling to the twisted-pair line. In the transmit function, the framer accepts a digital signal and outputs to the data pump a serial digital signal that includes the data payload plus an HDSL2 overhead. In the receive function, the framer receives HDSL frames from the data pump.

The data pump includes a transceiver and an analog front end for receives the HDSL frames serially from the framer. The transceiver converts the HDSL frames into a transmit signal by first converting the HDSL frames into symbols. Typically, a modulator, such as a trellis code modulator (TCM) encodes the symbols into a pulse amplitude modulation (PAM) signal. The signal is further processed to condition and filter the PAM signal. The analog front end provides pulse shaping to analog signals. This process is reversed in the receive channel with echo cancellation provided to cancel most of the echoed transmit signal.

As mentioned, the analog front end includes a transmit and a receive channel. In the transmit channel, the analog front end receives a pulse width modulated signal stream from the transceiver. A switched-capacitor circuit filter shapes the transmitted signal to meet specific spectral templates. The receive channel consists of an automatic gain control (AGC) stage and an analog-to-digital (A/D) converter. The AGC stage sets the amplitude to the optimum level to prevent saturation of the A/D converter.

Switched-capacitor circuits are needed in communication applications to implement accurate on chip filters. Active implementation of these switched-capacitor circuit requires amplifiers with extremely high gain, and hence with high output impedance. A switched-capacitor stage using such an amplifier is not suitable for driving the output, which can be very low impedance. In such cases, the output of the switched-capacitor filter needs to be buffered using a continuous time unity gain buffer. This continuous time stage is required to have unity gain, high input impedance, low distortion and capability to drive low output impedance. Such a circuit stage requires matching of input common mode to the output common mode to keep signal distortion low through this stage.

The switched-capacitor filter stage uses a switched-capacitor common mode feedback circuit to implement the common mode control loop. This common mode feedback circuit has the advantage of low power, however the output common mode of the circuit can have noticeable offset from the common mode reference signal. This is due to charge injected on various bias nodes due to the switches. This error charge, and hence the offset can be minimized by increasing the size of the common mode feedback capacitor. This however increases the loading of the switched-capacitor amplifier and hence increases power consumption.

To solve this problem, a high input impedance unity gain buffer, with low noise and distortion performance, is implemented using differential circuit techniques for good common mode noise rejection. This differential circuit has its own output common mode control loop, which now is in continuous time domain. The unity gain stage is implemented with direct feedback from the output of the amplifier to the input of the amplifier, without any additional component. This allows the input of the amplifier to have the high input impedance of an MOS device, and hence not effect the amplifier gain of the previous switched-capacitor stage. However this also requires that the two input terminals (two for each side of the differential pair, total four terminals) of the amplifier track each other and have same DC level for appropriate biasing of the amplifier. Common mode errors can occur at the switched-capacitor and continuous time interface due to use of a switched-capacitor common mode feedback in one domain versus continuous time common mode feedback in another domain. Excessive offset between these terminals will result in distortion in this stage. Even when the common mode reference signal for both stage are same, there will be mismatches in these two common mode levels due to switched-capacitor related charge injection in the switched-capacitor common mode circuit, and this offset leads to distortion in the unity gain amplifier, which is undesirable.

It can be seen then that there is a need for a method and apparatus for matching common mode output voltage at a switched-capacitor to continuous-time interface.

It can also be seen then that there is a need for a method and apparatus for creating a continuous time measure of the common mode output of the switched-capacitor stage for use as the reference input for the continuous time stage. It can be seen then that there is a need for a method and apparatus for that tracks the output common mode of the output unity gain differential operational amplifier for eliminating common mode errors between the inputs of the amplifier and for reducing distortion in the output replica signal.

SUMMARY OF THE INVENTION

To overcome the limitations in the prior art described above, and to overcome other limitations that will become apparent upon reading and understanding the present specification, the present invention discloses a method and apparatus for matching common mode output voltage at a switched-capacitor to continuous-time interface.

The present invention solves the above-described problems by using an active continuous time summation circuit at the output of the switched-capacitor stage to derive the common mode level that is at the output of the switched-capacitor stage. This derived signal is filtered to remove any noise component remaining in it, and is then used as the reference common mode signal in the continuous time stage. This forces the output common mode, and hence the input common mode of the unity gain amplifier stage, to track the common mode output of the switched-capacitor stage. This adaptive tracking eliminates the common mode interface error, which could be present and could vary from die to die (due to parasitic variations). This technique ensures proper tracking of the DC levels between the negative and the positive terminals of the unity gain amplifier, which is essential for low distortion operation of the amplifier.

A method in accordance with the principles of the present invention includes generating a reference common mode signal of the first domain, generating a common mode signal of the second domain, processing the reference common mode signal of the first domain and the common mode signal of the second domain and generating a common mode control signal for the second domain in response to the processing.

Other embodiments of a method in accordance with the principles of the invention may include alternative or optional additional aspects. One such aspect of the present invention is that the first domain is a switched-capacitor stage.

Another aspect of the present invention is that the second domain is a continuous time domain.

Another aspect of the present invention is that the first domain is a switched-capacitor stage and the second domain is a buffer amplifier stage.

Another aspect of the present invention is that the generating reference common mode signal of the first domain further includes sampling a pair of output signals from the switched capacitor stage, buffering the pair of output signals to produce a pair of buffered signals, summing the pair of buffered signals to produce a derived common mode signal and filtering the derived common mode signal to produce a filtered reference common mode signal.

Another aspect of the present invention is that the filtering removes the switched-capacitor noise from the derived common mode signal.

Another aspect of the present invention is that the generating a common mode signal of the second domain further includes sampling a pair of output signals from the buffer amplifier stage to produce a pair of common mode signals of the buffer amplifier stage and summing the pair of common mode signals of the buffer amplifier stage to produce a common mode signal for the buffer amplifier stage.

Another aspect of the present invention is that the processing further comprises comparing the filtered reference common mode signal with the common mode signal for the buffer amplifier stage.

Another aspect of the present invention is that the generating a common mode control signal for the second domain in response to the processing further comprises generating an error signal based upon the comparison of the filtered reference common mode signal with the common mode signal for the buffer amplifier stage.

Another aspect of the present invention is that the error signal eliminates common mode interface error between the buffer amplifier stage and the switched-capacitor stage.

Another aspect of the present invention is that the error signal allows the transfer of output signals from the switched-capacitor stage to a low impedance load in the presence of common mode offset in the switched-capacitor output stage.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for tracking the common mode output of a continuous time differential circuit stage to the common mode output of the preceding switched-capacitor differential stage is presented. It is difficult to control the exact common mode offset of the switched-capacitor stage and hence the error between that and the common mode reference level. This tracking is critical in reproducing a low distortion replica of the switched-capacitor filter output at the output of the chip into a low impedance load.

Figure 1:
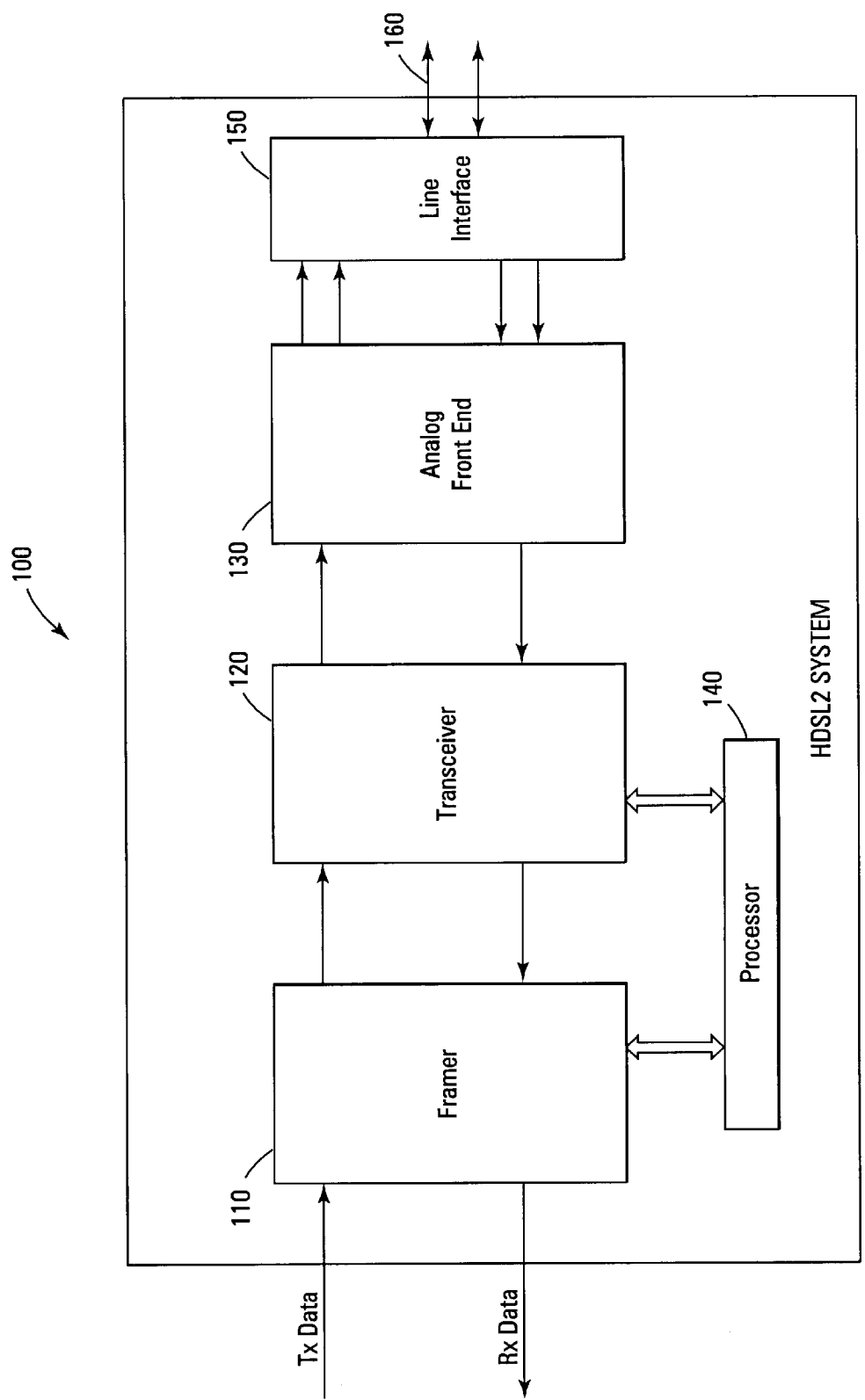
FIG. 1 illustrates a block diagram of an HDSL2 system according to the present invention.

FIG. 1 illustrates a block diagram of an HDSL2 system 100 according to the present invention. In FIG. 1, the system includes a framer 110, a transceiver 120 and an analog front end 130. The framer 110 provides frame mapping for embedding T1/E1 digital signals (DS1 payloads) into HDSL2 frames. The framer 110 also adds forward error correction codes to the HDSL2 frames to overcome local loop impairments and to provide increased noise margins. The transceiver 120 provides timing recovery, adaptive equalization, echo cancellation and modulation, e.g., pulse amplitude modulation. The analog front end 130 receives a pulse width modulated data stream in the form of four bit digital signals and converts the digital signals to an analog output after providing pulse shaping to shape the analog output signal to meet predetermined spectral templates. A processor 140 controls the framer 110 and the transceiver 120. A line interface 150 couples the analog front end 130 to /the twisted-pair line 160.

Figure 2:
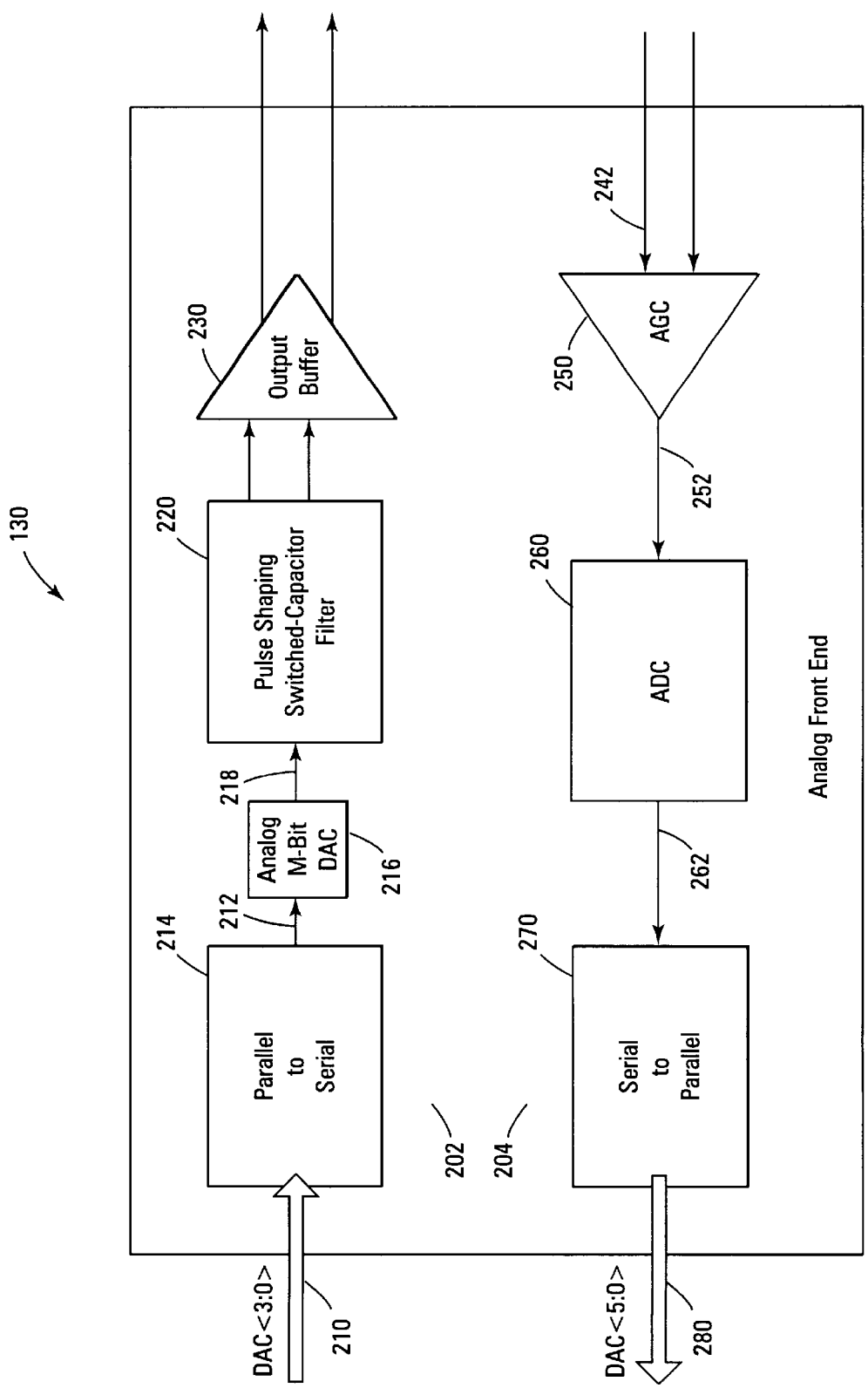
FIG. 2 illustrates a block diagram of the analog front end according to the present invention.

FIG. 2 illustrates a block diagram of an example analog front end 130 of the HDSL2 system of FIG. 1. In FIG. 2, the four-bit, parallel digital signal 210 is received and converted to a serial signal 212 via the parallel-to-serial converter 214 in the transmit channel 202, and provided to the analog digital-to-analog converter (DAC) 215 where the signal is converted to digital form In one embodiment, the DAC 215 is a multi-bit DAC, such as a 2-bit DAC. The serial signal is shaped by the switched-capacitor filter 220. An output buffer 230 provides a unity gain, high input impedance, and low distortion, as well as the capability to drive low output impedance.

In the receive channel 204 of the analog front end 130, the analog signals 242 are received and processed by an automatic gain control (AGC) circuit 250. The output 252 from the AGC 250 is provided to an analog-to-digital (A/D) converter 260, e.g. a delta-sigma A/D converter. A serial-to-parallel converter 270 receives the digital signal 262 from the A/D converter 260 and provides a six bit, parallel signal 280 back to the transceiver 120.

Figure 3:
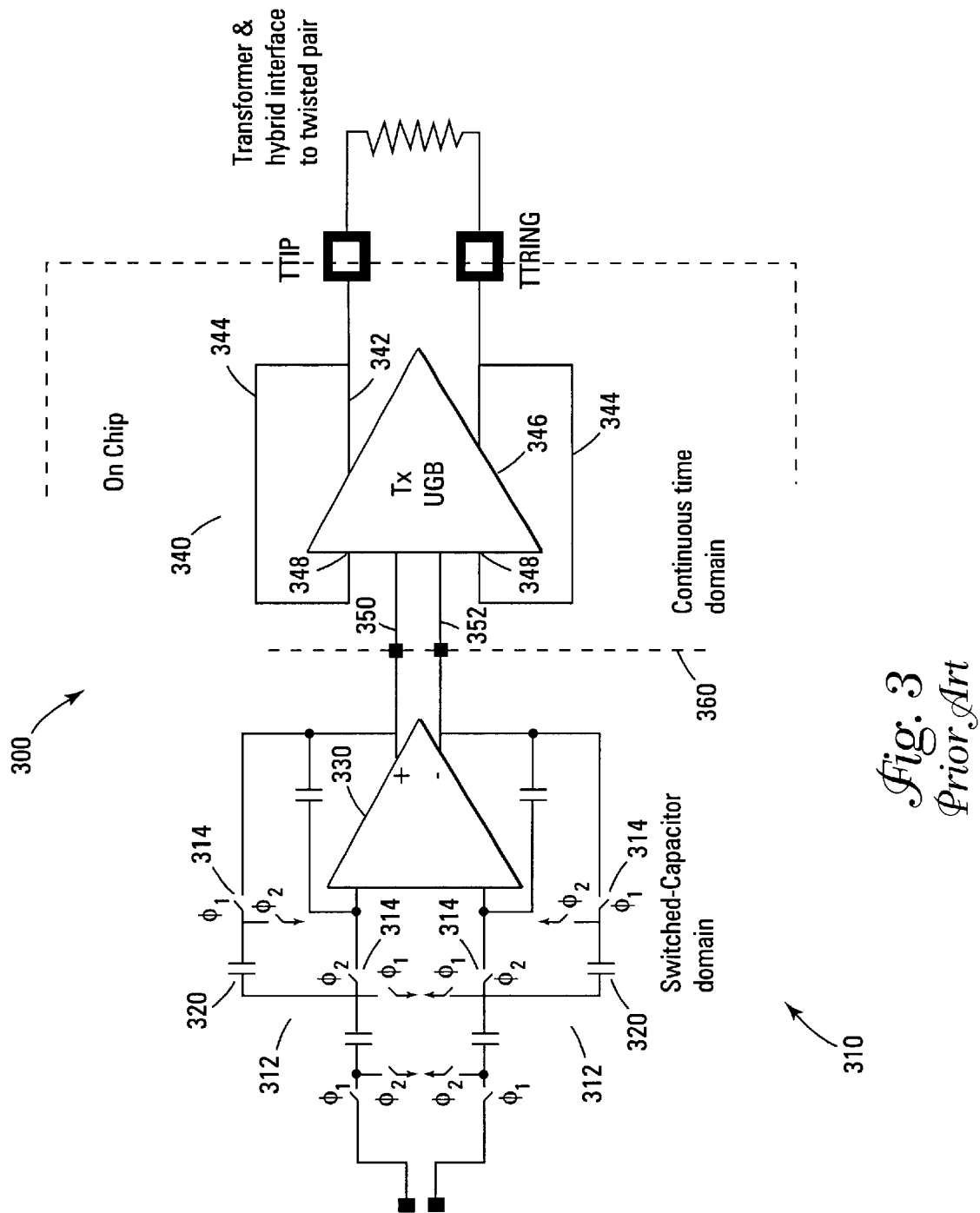
FIG. 3 illustrates a prior art switched-capacitor to continuous-time interface.

FIG. 3 illustrates a prior art switched-capacitor to continuous-time interface 300. In FIG. 3, the switched-capacitor filter stage 310 uses a switched-capacitor common mode feedback circuit 312 to implement the common mode control loop. This common mode feedback circuit 312 has the advantage of low power. However the output common mode of the circuit can have noticeable offset from the common mode reference signal. This is due to charge injected on various bias nodes from the switches 314. This error charge, and hence the offset can be minimized by increasing the size of the common mode feedback capacitor 320. This however increases the loading of the switched-capacitor amplifier 330 and hence increases power consumption.

A high input impedance unity gain buffer 340, with low noise and distortion performance, is implemented using differential circuit techniques for good common mode noise rejection. This differential circuit has its own output common mode control loop, which now is in continuous time domain. The unity gain stage 340 is implemented with direct feedback 342 from the output 344 of the amplifier 346 to the input 348 of the amplifier 346, without any additional component. This allows the amplifier 346 to have the high input impedance of a MOS device, and hence not effect the amplifier gain of the previous switched-capacitor stage 310. However, this also requires that the two input signals 350, 352 (two for each side of the differential pair, total four signals) of the amplifier 346 track each other and have same DC level for appropriate biasing of the amplifier 346. Common mode errors can occur at the switched-capacitor and continuous time interface 360 due to use of a switched-capacitor common mode feedback in the switched-capacitor domain 310 versus continuous time common mode feedback in the continuous time domain 340.

Figure 4:
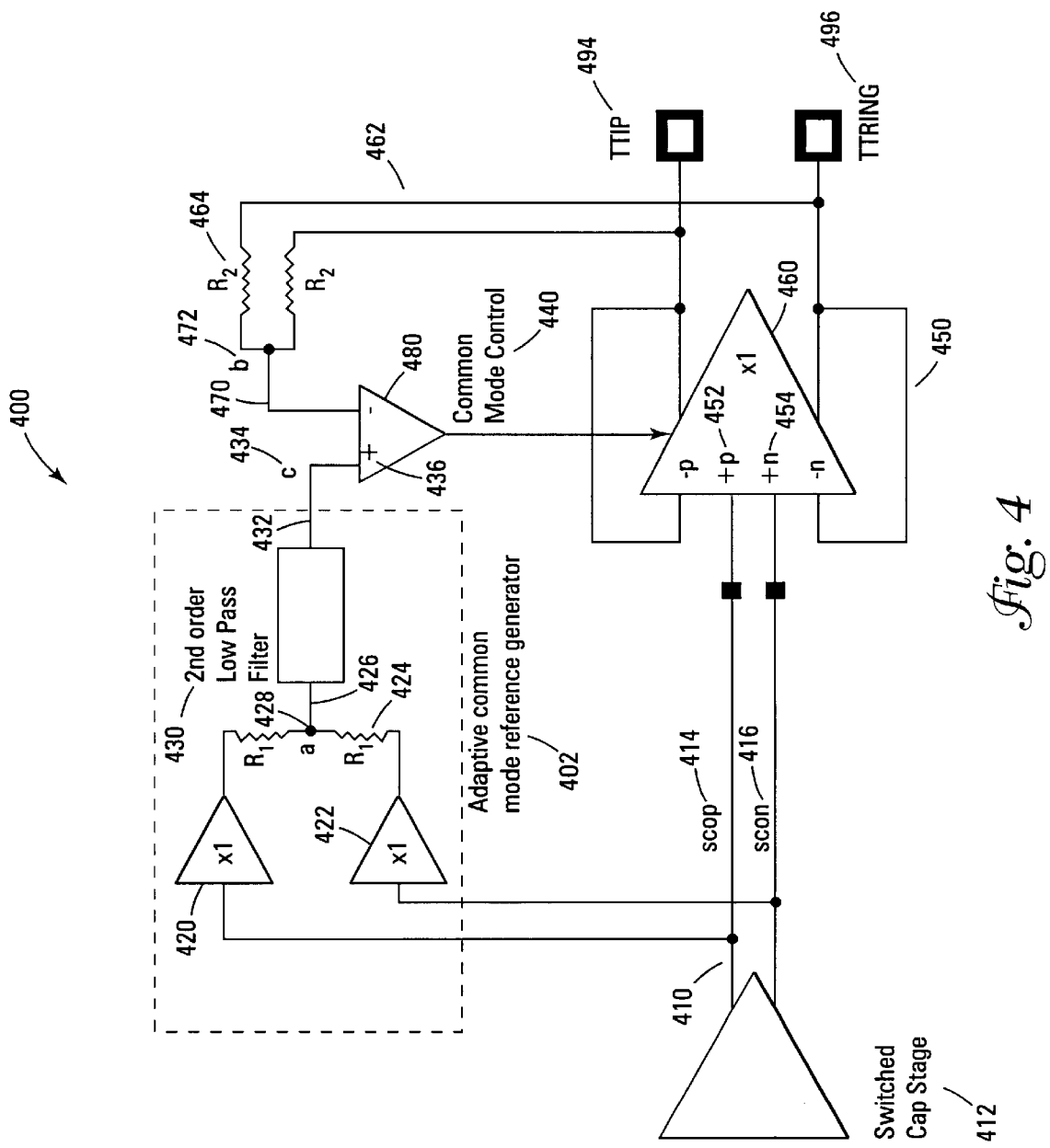
FIG. 4 illustrates a tracking common mode reference generator 400 according to the present invention.

FIG. 4 illustrates a common mode interface for tracking the common mode of a switched capacitor circuit and a buffer amplifier 400 according to the present invention. In FIG. 4, a common mode interface 402 is designed to create the effective common mode at the output 410 of the switched-capacitor filter stage 412. A pair of unity gain operation amplifiers 420, 422 are used to buffer the signals before using a resistive summing network 424 (Resistors $R_1$) to generate the common mode signal 426 on node "a" 428. Since these buffers 420, 422 are not in the direct signal path, the distortion and performance requirement on these buffers 420, 422 are not critical and the design is simple. The only requirement on these buffers 420, 422 is that they be low offset. The buffers 420, 422 provide minimal loading on the switched-capacitor stage output 410.

The summed output signal 428 at node "a" 426 will have some common mode switching noise on it since it is summation of the switched-capacitor stage output 410. This signal 426 is filtered using a two stage low pass filter 430 to generate a very low frequency signal 432 representing the switched-capacitor common mode voltage. The filter 430 includes simple filter stages built using MOS devices. The filtered signal 432 at node "c" 434 is used as the reference common mode signal 436 for the common mode control 440 of the continuous time output stage 450. This derived common mode reference voltage signal 432 will track the common mode at the positive inputs 452, 454 of the unity gain differential operation amplifier 460.

The common mode feedback 462 for the unity gain differential output stage 450 is implemented using a continuous time loop. Resistors $R_2$ 464 are used to generate the common mode output of this amplifier 460. This common mode signal 470 at node "b" 472 is compared to reference common mode signal 432 at node "c" 434, using an operational amplifier 480. Based on the error or the difference in the signals, the current source bias in the unity gain amplifier 460 is adjusted to remove difference between signals at nodes "b" 472 and "c" 434.

This technique guarantees that the common mode level at nodes ttip 492 and tring 494 will track common mode level at nodes scop 414 and scon 416. The technique allows for use of a switched-capacitor common mode feedback in the switched-capacitor domain 412 and that of a continuous time common mode feedback circuit 462 in the continuous time domain 450 without causing any offset between the output common mode signals of the two stages 412, 450. This is critical to ensure good distortion performance from the unity gain differential operational amplifier 460.

In summary, the present invention provides an active continuous time summation circuit at the output of the switched-capacitor stage to derive the common mode level that is at the output of the switched-capacitor stage. This derived signal is filtered to remove any noise component remaining in it, and is then used as the reference common mode signal in the continuous time stage. This forces the output common mode, and hence the input common mode of the unity gain amplifier stage, to track the common mode output of the switched-capacitor stage. This adaptive tracking eliminates the common mode interface error, which could be present and could vary from die to die (due to parasitic variations). This technique ensures proper tracking of the DC levels between the negative and the positive terminals of the unity gain amplifier, which is essential for low distortion operation of the amplifier.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for tracking the common mode output of a first domain to a common mode output of a second domain, comprising:
   generating a reference common mode signal of the first domain;
   generating a common mode signal of the second domain;
   processing the reference common mode signal of the first domain and the common mode signal of the second domain; and
   generating a common mode control signal for the second domain in response to the processing.

2. The method of claim 1 wherein the first domain is a switched-capacitor stage.

3. The method of claim 1 wherein the second domain is a continuous time domain.

4. The method of claim 3 wherein the first domain is a switched-capacitor stage.

5. The method of claim 1 wherein the first domain uses switched-capacitor common mode feedback in the first domain and continuous time common mode feedback in the second domain.

6. The method of claim 1 wherein the first domain is a switched-capacitor stage and the second domain is a buffer amplifier stage.

7. The method of claim 1 wherein the generating reference common mode signal of the first domain further comprises:
   sampling a pair of output signals from the switched capacitor stage;
   buffering the pair of output signals to produce a pair of buffered signals;
   summing the pair of buffered signals to produce a derived common mode signal; and
   filtering the derived common mode signal to produce a filtered reference common mode signal.

8. The method of claim 7 wherein the filtering removes the switched-capacitor noise from the derived common mode signal.

9. The method of claim 7 wherein the generating a common mode signal of the second domain further comprises
   sampling a pair of output signals from the buffer amplifier stage to produce a pair of common mode signals of the buffer amplifier stage; and
   summing the pair of common mode signals of the buffer amplifier stage to produce a common mode signal for the buffer amplifier stage.

10. The method of claim 9 wherein the processing further comprises comparing the filtered reference common mode signal with the common mode signal for the buffer amplifier stage.

11. The method of claim 10 wherein the generating a common mode control signal for the second domain in response to the processing further comprises generating an error signal based upon the comparison of the filtered reference common mode signal with the common mode signal for the buffer amplifier stage.

12. The method of claim 11 wherein the error signal eliminates common mode interface error between the buffer amplifier stage and the switched-capacitor stage.

13. The method of claim 12 wherein the error signal allows the transfer of output signals from the switched-capacitor stage to a low impedance load in the presence of common mode offset in the switched-capacitor output stage.

14. A common mode interface for tracking the common mode output of a switched-capacitor stage for providing a shaped differential output signal and a buffer amplifier stage for transferring the shaped differential output signal to a low output impedance via buffer amplifier stage differential output signals, comprising:
- a first circuit for generating a reference common mode signal for the switched-capacitor stage;
- a second circuit for generating a common mode signal for the buffer amplifier stage; and
- a third circuit for processing the reference common mode signal and the common mode signal of the buffer amplifier stage and for generating a common mode control signal for the buffer amplifier stage in response to the processing.

15. The common mode interface of claim 14 wherein the buffer amplifier is a continuous time domain.

16. The common mode interface of claim 14 wherein the first circuit further comprises:
- a pair of buffer amplifiers for sampling the differential output of the switched-capacitor stage and producing a pair of buffered signals;
- a summing node for summing the pair of buffered signals to produce a derived common mode signal; and
- a filter for filtering the derived common mode signal to produce a filtered reference common mode signal.

17. The common mode interface of claim 16 wherein the filter removes the switched-capacitor noise from the derived common mode signal.

18. The common mode interface of claim 14 wherein the second circuit further comprises:
- a common mode feedback loop, the common mode feedback loop comprising a first and second path for sampling the differential output signal from the buffer amplifier stage to produce a pair of common mode signals, the common mode feedback loop further comprising a resistor in each of the first and second path and a summing node summing the pair of common mode signals to generate the common mode signal for the buffer amplifier stage.

19. The common mode interface of claim 14 wherein the third circuit is a comparator.

20. The common mode interface of claim 14 wherein the common mode control signal comprises an error signal based upon the comparison of the filtered reference common mode signal with the common mode signal for the buffer amplifier stage.

21. The common mode interface of claim 20 wherein the error signal eliminates common mode interface error between the buffer amplifier stage and the switched-capacitor stage.

22. The common mode interface of claim 20 wherein the error signal allows the transfer of the differential output signals from the switched-capacitor stage to a low impedance load in the presence of common mode offset in the switched-capacitor output stage.

23. An analog front end system for a communications system, comprising:
(I.) a receive channel for receiving analog signals and processing the analog signals to produce digital output signals; and
(II.) a transmit channel for processing received digital signals, the transmit channel comprising:
  (A.) a switched-capacitor stage for providing a shaped differential output signal;
  (B.) a buffer amplifier stage for transferring the shaped differential output signal to a low output impedance via buffer amplifier stage differential output signals; and
  (C.) a common mode interface for tracking a common mode output of the switched-capacitor stage and the buffer amplifier stage, the common mode interface further comprising:
    (i.) a pair of buffer amplifiers for sampling the differential output of the switched-capacitor stage and producing a pair of buffered signals;
    (ii.) a summing node for summing the pair of buffered signals to produce a derived common mode signal; and
    (iii.) a filter for filtering the derived common mode signal to produce a filtered reference common mode signal.

24. A HDSL2 system, comprising:
(I.) a framer for providing frame mapping of T1/E1 digital signals into HDSL2 frames;
(II.) a transceiver, coupled to the framer, for processing HDSL2 frames into digital signals for transmission; and
(III.) an analog front end, coupled to the transceiver, for converting the digital signals into analog signals and shaping a spectral content of the analog signals, wherein the analog front end further comprises:
  (A.) a receive channel for receiving analog signals and processing the analog signals to produce digital output signals; and
  (B.) a transmit channel for processing received digital signals, the transmit channel comprising:
    (i.) a switched-capacitor stage for providing a shaped differential output signal;
    (ii.) a buffer amplifier stage for transferring the shaped differential output signal to a low output impedance via buffer amplifier stage differential output signals; and
    (iii.) a common mode interface for tracking a common mode output of the switched-capacitor stage and the buffer amplifier stage, the common mode interface further comprising:
      (a.) a pair of buffer amplifiers for sampling the differential output of the switched-capacitor stage and producing a pair of buffered signals;
      (b.) a summing node for summing the pair of buffered signals to produce a derived common mode signal; and
      (c.) a filter for filtering the derived common mode signal to produce a filtered reference common mode signal.

* * * * *